(12) United States Patent
Ushio

(10) Patent No.: US 6,392,566 B2
(45) Date of Patent: May 21, 2002

(54) CODE MODULATOR AND CODE MODULATION METHOD

(75) Inventor: Teruhiko Ushio, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/773,225

(22) Filed: Jan. 30, 2001

(30) Foreign Application Priority Data

Jan. 31, 2000 (JP) ........................................ 2000-022327

(51) Int. Cl.[7] .............................................. H03M 7/00
(52) U.S. Cl. ............................. 341/50; 341/106; 341/58
(58) Field of Search ............................. 341/50, 51, 52, 341/106, 87, 58

(56) References Cited

U.S. PATENT DOCUMENTS 4,280,192 A * 7/1981 Moll ........................... 341/155
5,265,104 A * 11/1993 Weng .......................... 714/766
5,600,316 A * 2/1997 Moll ........................... 341/67

* cited by examiner

Primary Examiner—Peguy JeanPierre
(74) Attorney, Agent, or Firm—Ron Feece

(57) ABSTRACT

A method and apparatus are provided for modulating code for use with written optical disks such as digital video disks (DVD). The invention falitates 8/16 modulation by eliminating duplicate code conversion and by reducing the number of times that conversion codes must be looked up from a conversion table. A conversion code corresponding to a received input code is specified from among a plurality of conversion codes. Duplication information corresponding to the input code is read from a pre-processing table and duplicate information indicated duplicate conversion codes in the plurality of conversion codes is stored. Conversion code corresponding to the input code is read from the conversion table and is selectively stored with duplicate conversion codes being omitted.

17 Claims, 13 Drawing Sheets

Fig.2(a)

| Main table | Group 1 |
| | Group 2 |
| | Group 3 |
| Sub-table | Group 1 |
| | Group 2 |
| | Group 3 |

Fig.2(b)

| Input | Conversion code , NS |
|---|---|
| 0 | 0010000000001001 |
| 1 | 0010000000010010 |
| 2 | 0010000100100000 ,2 |
| ⋮ | ⋮ |
| 86 | 0001000001000100 ,3 |
| 87 | 0001000010001000 ,3 |
| 88 | 0001000100010000 ,3 |
| 89 | 0001001000100000 ,3 |
| ⋮ | ⋮ |
| 253 | 0000010000100001 |
| 254 | 0000001001000100 ,2 |
| 255 | 0000001000001000 ,2 |

Fig.2(c)

| Input | Conversion code , NS |
|---|---|
| 0 | 0000010010000000 |
| 1 | 0000100100000000 |
| 2 | 0001001000000000 |
| ⋮ | ⋮ |
| 85 | 0010010010010000 ,2 |
| 86 | 0000000100000100 ,2 |
| 87 | 0000000100100100 ,2 |

Fig. 3

| Input | Pattern (main, sub) | DSVc, PB (STATE 1) | DSVc, PB (STATE 2) | DSVc, PB (STATE 3) | DSVc, PB (STATE 4) |
|---|---|---|---|---|---|
| 0 | B, A | 2, M | 1, M | -1, S | -2, S |
| 1 | A, A | 2, M | 2, M | -3, S | -3, S |
| 2 | A, A | 2, M | 2, M | -3, S | -3, S |
| ...... | ...... | ...... | ...... | ...... | ...... |
| 86 | A, D | 1, M | -1, S | -2, M | -2, M |
| 87 | B, D | 1, M | -3, S | -1, S | -3, S |

Fig.4

| Input | Pattern | DSVc , PB | "0" number information (STATE1) | "0" number information (STATE4) |
|---|---|---|---|---|
| 88 | A | −3 , 4 | 3 | "1" |
| 89 | A | −3 , 4 | 3 | "1" |
| ⋮ | ⋮ | ⋮ | ⋮ | ⋮ |
| 253 | A | 2 , 4 | 5 | "0" |
| 254 | D | 2 , 4 | 5 | "0" |
| 255 | D | 2 , 4 | 5 | "0" |

Fig.5(a)

| Pattern A | Pattern B | Pattern C | Pattern D |
|---|---|---|---|
| STATE 1 = STATE 2 and STATE 3 = STATE 4 | STATE 1 = STATE 3 and STATE 2 = STATE 4 | STATE 1 = STATE 2 and STATE 3 ≠ STATE 4 | STATE 1 ≠ STATE 3 and STATE 2 = STATE 4 |

Fig.5(b)

|  | Pattern A | Pattern B | Pattern C | Pattern D |
|---|---|---|---|---|
| Main table | 171 | 62 | 1 | 22 |
| Sub-table | 46 | 4 | 0 | 38 |

Fig. 6

| | Group 1 | Group 2 | Group 3 |
|---|---|---|---|
| Pattern A | STATE 1 (=STATE 2) | STATE 4 (=STATE 3) | |
| Pattern B | STATE 1 (=STATE 3) | STATE 4 (=STATE 2) | |
| Pattern C | STATE 1 (=STATE 2) | STATE 4 | STATE 3 |
| Pattern D | STATE 1 | STATE 4 (=STATE 2) | STATE 3 |

Fig.7

| Input | Pattern (main, sub) | DSVc (STATE 1) | DSVc (STATE 2) | DSVc (STATE 3) | DSVc (STATE 4) |
|---|---|---|---|---|---|
| 0 | B, A | 2 | 1 | −1 | −2 |
| 1 | A, A | 2 | 2 | −3 | −3 |
| 2 | A, A | 2 | 2 | −3 | −3 |
| ⋯ | ⋯ | ⋯ | ⋯ | ⋯ | ⋯ |
| 86 | A, D | 1 | −1 | −2 | −2 |
| 87 | B, D | 1 | −3 | −1 | −3 |

Fig.8 (a)

| Input | Pattern | DSVc | "0" number information (STATE1) | "0" number information (STATE4) |
|---|---|---|---|---|
| 88 | A | −3 | 3 | "1" |
| 89 | A | −3 | 3 | "1" |
| ⋮ | ⋮ | ⋮ | ⋮ | ⋮ |
| 253 | A | 2 | 5 | "0" |
| 254 | D | 2 | 5 | "0" |
| 255 | D | 2 | 5 | "0" |

Fig.8 (b)

| Input | Pattern | DSVc , PB |
|---|---|---|
| 88 | A | −3 , 4 |
| 89 | A | −3 , 4 |
| ⋮ | ⋮ | ⋮ |
| 253 | A | 2 , 4 |
| 254 | D | 2 , 4 |
| 255 | D | 2 , 4 |

Fig.9 (a)

| Input | Pattern |
|---|---|
| 0 | B |
| 1 | A |
| 2 | A |
| ⋮ | ⋮ |
| 86 | A |
| 87 | B |
| 88 | A |
| 89 | A |
| ⋮ | ⋮ |
| 253 | A |
| 254 | D |
| 255 | D |

Fig.9 (b)

| Input | Pattern |
|---|---|
| 0 | A |
| 1 | A |
| 2 | A |
| ⋮ | ⋮ |
| 86 | D |
| 87 | D |

Fig. 11 (Prior Art)

| Input | Conversion code, NS (STATE 1) | Conversion code, NS (STATE 2) | Conversion code, NS (STATE 3) | Conversion code, NS (STATE 4) |
|---|---|---|---|---|
| 0 | 001000000001001 ,1 | 010000010100000 ,2 | 001000000001001 ,1 | 010000100100000 ,2 |
| 1 | 001000000010010 ,1 | 001000000010010 ,1 | 100000100100000 ,3 | 100000100100000 ,3 |
| 2 | 001000100100000 ,2 | 001000100100000 ,2 | 100000000010010 ,1 | 100000000010010 ,1 |
| ... | ... | ... | ... | ... |
| 86 | 000100001000100 ,3 | 000100001000100 ,3 | 100100100100100 ,2 | 100100100100100 ,2 |
| 87 | 000100001001000 ,3 | 010000100100000 ,3 | 000100010001000 ,3 | 010000100100000 ,3 |
| 88 | 000100010010000 ,3 | 000100010010000 ,3 | 100100100101000 ,3 | 100100100101000 ,3 |
| 89 | 000100100100000 ,3 | 001001001000000 ,3 | 100100010000001 ,1 | 100100010000001 ,1 |
| ... | ... | ... | ... | ... |
| 253 | 000000100000001 ,1 | 000001000100000 ,1 | 010010001001001 ,1 | 010010001001001 ,1 |
| 254 | 000000010010100 ,2 | 010001000010001 ,1 | 100100000010000 ,2 | 010001000010001 ,1 |
| 255 | 000000100001000 ,2 | 010001000001010 ,1 | 100010010010000 ,2 | 010000100010010 ,1 |

Fig. 12 (Prior Art)

| Input | Conversion code, NS (STATE 1) | Conversion code, NS (STATE 2) | Conversion code, NS (STATE 3) | Conversion code, NS (STATE 4) |
|---|---|---|---|---|
| 0 | 000001001000000 , 4 | 000001001000000 , 2 | 010010001001000 , 2 | 010010001001000 , 2 |
| 1 | 000010010000000 , 4 | 000010010000000 , 2 | 010010001001000 , 3 | 010010001001000 , 3 |
| 2 | 000100100000000 , 4 | 000100100000000 , 2 | 010010000001001 , 1 | 010010000001001 , 1 |
| ...... | ...... | ...... | ...... | ...... |
| 85 | 001001001010000 , 2 | 001001001010000 , 2 | 010001001001001 , 1 | 010001001001001 , 1 |
| 86 | 000000010000100 , 2 | 010000100000100 , 2 | 100010001000100 , 2 | 010000100010100 , 2 |
| 87 | 000000010100100 , 2 | 010001001000100 , 2 | 100010010001000 , 2 | 010001001000100 , 2 |

CODE MODULATOR AND CODE MODULATION METHOD

BACKGROUND OF THE INVENTION

1. Field of the Invention

The present invention relates to a code modulator and a code modulation method, particularly to a modulator and a modulation method for modulating input codes on the basis of a table in which modulation codes corresponding to input codes are stored, and more particularly to a modulator and a modulation method for modulating codes to be written in optical disks such as DVDs (Digital Video Disks).

2. Description of Related Art

In order to modulate code in a DVD, a modulation system referred to as an 8/16 modulation is used. The 8/16 modulation converts an 8-bit input code into a 16-bit code, and records the converted 16-bit code in succession to a 16-bit code obtained by converting the immediately previous input code. The code forms a bit string of bits having a "0" value and bits having a "1" value. In the bit string, the minimum number of bits having a "0" value positioned between two bits having a "1" value is defined as 2 and the maximum is defined as 10, which is hereinafter referred to as RLL (2.10) requirements. Note that RLL is an abbreviation for Run Length Limited. The conversion of an 8-bit code to a 16-bit code is carried out on the basis of a conversion table in which conversion codes corresponding to input codes are stored.

FIG. 10 shows a structural example of a code modulator 80 for executing the 8/16 modulation. This modulator 80 converts an 8-bit (0 to 255) input code to a 16-bit code, and includes a conversion table 84 and a code conversion section 82.

The conversion table 84 includes a main table and a sub-table. As shown in FIG. 11, the main table stores a plurality of conversion codes (STATE 1, 2, 3, 4) corresponding to respective input codes of 0 to 255. As shown in Table 12, the sub-table stores a plurality of conversion codes (STATE 1, 2, 3, 4) corresponding to respective input codes of 0 to 87. Normally, a ROM (Read Only Memory) is used as the conversion table 4.

A value NS (NS=1, 2, 3 or 4) is added to each conversion code. When a conversion code is used in a conversion of an input code, the value NS indicates a STATE of a conversion code that is used for the conversion of the next input code. For example, in the case where a conversion code having an input of 255 and a STATE of "3" is used, the NS value of that conversion code is "2". Therefore, in the next input (for example, 89) code conversion, the conversion code having an input of 89 and a STATE of "2" is used.

Next, an explanation of the next STATE (NS) and respective conversion codes will be given. In this embodiment, where the last bit or the last two bits of the conversion code used in an input code conversion is/are "1" or "1 0", a conversion code of STATE 1 is designated as the conversion code used for the next code conversion. In this case, in order to satisfy the RLL (2.10) requirements, the first two bits to nine bits of bit string of the conversion code of STATE 1 are continuous "0"s.

Where last two bits to five bits of the conversion code used in an input code conversion are continuous "0"s, a conversion code of STATE 2 or STATE 3 is designated as the conversion code used for the next code conversion in this embodiment. In order to satisfy the RLL (2.10) requirements, the first bit of the conversion codes of STATE 2 and STATE 3 are "1" or the first five bits of the conversion codes of STATE 2 and STATE 3 are continuous "0"s. In this case, the first bit and the 13th bit of the conversion code of STATE 2 are always "0", and the first bit and/or the 13th bit of the conversion code of STATE 3 is/are always "1".

Where the last six bits to nine bits of the conversion code used in an input code conversion are continuous "0"s, a conversion code of STATE 4 is designated as the conversion code used for the next code conversion in this embodiment. In this case, in order to satisfy the RLL (2. 10) requirements, the first one bit or the first two bits of the conversion code of STATE 4 is "1" or "0 1".

In this manner, a conversion code of STATE designated by the NS (the next STATE) added to each conversion code is used for the conversion of the next input code, so that the RLL (2.10) requirements can be always satisfied.

The code conversion section 82 comprises: an arithmetic unit 22 for calculating DSV (digital sum value), which will be described later; a comparator 24 for comparing DSV values; a memory (storage device) 28 for storing DSV value obtained up to the current conversion (to be described later) and STATE (NS) of the conversion code to be used for the next code conversion as described above; and a control section 26 for specifying STATE to be used in a next code conversion on the basis of the NS value of the memory 28 and converting the input code by controlling the arithmetic unit 22 and the comparator 24.

Wherever an input code is converted, the NS value (1, 2, 3 or 4) added to the conversion code is stored in the memory 28. According to the NS value stored in the memory 28, it is possible to specify which conversion code to be used among STATE 1 to STATE 4 for the next input code conversion.

In this manner, according to the NS value stored in the memory 28, it is possible to specify a conversion code to be used among a plurality of conversion codes (STATES 1 to 4) corresponding to an input code. However, as shown in FIGS. 11 and 12, there are two kinds of conversion codes corresponding to input codes of 0 to 87; one in a main table and the other in a sub-table. For this reason, either one of them needs to be selected. The conversion procedures in the case of input codes of 0 to 87 are different from those in the case of input codes of 88 to 255.

Where an input code is any one of 0 to 87, the corresponding conversion code is selected from either the main table or the sub-table. The selection of the conversion code is carried out by using the DSV values. As shown in FIG. 13, the DSV value is the integral of bit outputs whose polarity is inverted wherever "1" appears in the code. In the actual selection, the accumulated value of DSV values of conversion codes that have been used up to the current code conversion (hereinafter also referred to as DSV value obtained up to the current conversion). The DSV value up to the current conversion is calculated in the arithmetic unit 22 wherever an input code is converted, and then stored in the memory 28. The selection of the conversion code is carried out so that the DSV value up to the current conversion may approach zero.

Specifically, a conversion code can be specified by reading an NS value (a next STATE) from the memory 28 on the basis of the input code and STATE. A conversion code specified in the main table is read, and then a DSV value in the case of using this conversion code is obtained. This DSV value is obtained by adding the DSV of the conversion code itself to the DSV value obtained up to the current conversion. In the same manner, a conversion code specified in the sub-table is read, and then a DSV value corresponding to this conversion code is obtained. Thereafter, the two DSV values are compared, and the conversion code closer to zero is selected.

If the absolute values of the two DSV values are equal and the one closer to zero is not specified, the one having more number of polarity inversions is selected. If the numbers of polarity inversions are equal to each other, the one in the main table is selected. Thus, when the absolute values of the two DSV values are equal, a conversion code can be always selected from the main table without consideration of the number of polarity inversions, so that the process can be simplified.

Where an input code is in a range of 88 to 225, the corresponding conversion code is selected from the main table. In this case, however, when STATE 1 is specified on the basis of the NS value of the memory 28, the conversion code of STATE 4 may be used instead of that of STATE 1. In the same manner, when STATE 4 is specified, the conversion code of STATE 1 may be used instead of that of STATE 4.

In the selection of STATE 1 and STATE 4, a conversion code different from the originally specified conversion code is used, so that the converted code may not satisfy the RLL (2. 10) requirements in some cases. For this reason, when a different conversion code is used in place of the originally specified convention code, it is necessary to confirm whether or not the number of bits having a "0" value positioned between two bits having a "1" is two or more to ten or less. Where the different conversion code does not satisfy the RLL (2. 10) requirements, the originally specified conversion code is used. Alternatively, where the RLL (2. 10) requirements are satisfied, the selection of either STATE 1 or STATE 4 is made by using the DSV, in the same manner as the above-mentioned selection of either the main table or the sub-table in the case of an input code of 0 to 87.

Thus, in the conversion of the input code, a conversion code is read from the main table on the basis of an input code and an NS value of the memory 28, and then a DSV value in the case of using this conversion code is calculated. After that, when the input code is in a range of 0 to 87, a conversion code, which is a candidate for selection in the sub-table, is read, and a DSV value in the case of using this conversion code is calculated. When the input code is in a range of 88 to 225, the presence or absence of another selectable conversion code in the main table is checked. If there is a selectable conversion code in the main table, it is checked whether the selectable conversion code satisfies the RLL (2. 10) requirements. If the RLL (2. 10) requirements are satisfied, a DSV value in the case of using the conversion code is calculated. Thereafter, a conversion code is selected by comparing the DSV values.

Recently, the transfer rate of DVDs has been increased year by year, and the code modulation rate also. needs to be increased in accordance with the increase of the transfer rate. However, in the above-mentioned code modulator and modulation method, it is necessary to read codes twice from conversion tables. In addition to that, it is also necessary to check whether the read conversion code satisfies the RLL (2. 10) requiments, and to calculate the DSV in the case of using this conversion code. Moreover, there are also other problems. For example, the size of a conversion table becomes large and therefore a large area is occupied by the storage elements, and a large number of elements cause an increase in power consumption. In the conversion table 84 shown in FIGS. 11 and 12, the number of stored conversion codes is represented by:

$$256 \cdot \cdot 4 + 88 \cdot \cdot 4 = 1376.$$

SUMMARY OF THE INVENTION

It is an object of the present invention to reduce the size of a conversion table used for 8/16 code modulation.

It is another object of the invention to improve a transfer rate of a code.

These and other objects and advantages of the invention are attained in accordance with the principles of the present invention by providing a code modulator that converts an input code to one of a plurality of conversion codes. The present invention utilitizes a conversion table for storing conversion codes corresponding to input codes. Duplicate conversion codes are advantageously omitted from the plurality of conversion codes. A pre-processing table stores duplication information indicating a correspondence relationship between the conversion codes omitted from the plurality of conversion codes and the same conversion codes in the conversion table as the omitted conversion codes. A code specifying means specifies a conversion code to be used from the plurality of conversion codes, and a conversion code conversion means reads a conversion code corresponding to an input code from the conversion table on the basis of the specification done by the code specifying means and the duplication information stored in the pre-processing table.

In this code modulator, the conversion table stores conversion codes with duplicate conversion codes being omitted from the plurality of conversion codes. When the code specifying means specifies a conversion code stored in the conversion table, the code conversion means reads the specified conversion code. When the code specifying means specifies a conversion code omitted from the conversion table, the code conversion means reads the same conversion code as the omitted conversion code from the conversion table on the basis of the duplication information stored in the pre-processing table.

An aspect of the present invention provides a method for converting an input code to one of a plurality of conversion codes according to the present invention. According to this method a conversion code corresponding to an input code may be specified from among a plurality of conversion codes. Duplication information corresponding to the input code may then be read from a pre-processing table in which the duplication information indicating duplicate conversion codes in the plurality of conversion codes is stored. A conversion code corresponding to the input code can then be read from the conversion table which stores conversion codes with the duplicate conversion codes being omitted from the plurality of conversion codes on the basis of the code specification earlier performed and the duplication information read from the pre-processing table.

The code modulator and the code-modulation method according to the present invention makes it possible to downsize a conversion table. In addition, the present invention makes it possible to make a high-speed selection of either a conversion code specified to be used in the next code conversion and a conversion code specified to be used in place of the specified conversion code and a high speed checking of the RLL (2.10) requirements in the case of using a usable substitute of a conversion code.

BRIEF DESCRIPTION OF THE DRAWINGS

FIG. 2(a) shows a basic structure of a conversion table of the code modulator shown in FIG. 1;

FIG. 2(b) shows the conversion codes of group 1 in the main table of the conversion table shown in FIG. 2(a);

FIG. 2(c) shows the conversion codes of group 1 in the sub-table of the conversion table shown in FIG. 2(a);

FIG. 3 shows a pre-processing table of the code modulator shown in FIG. 1, wherein input codes are 0 to 87;

FIG. 4 shows a pre-processing table of the code modulator shown in FIG. 1, wherein input codes are 88 to 255;

FIGS. 5(a) and 5(b) are diagrams showing a classification of conversion codes shown in FIGS. 11 and 12, FIG. 5(a) showing pattern types to be classified, and FIG. 5(b) showing the number of input codes corresponding to the respective patterns;

FIG. 6 is a diagram showing a classification of conversion codes shown in FIGS. 11 and 12;

FIG. 7 shows another example of a pre-processing table of the code modulator shown in FIG. 1, wherein input codes are 0 to 87;

FIGS. 8(a) and 8(b) each show another example of a pre-processing table of the code modulator shown in FIG. 1, wherein input codes are 88 to 255;

FIGS. 9(a) and 9(b) each show still another example of a pre-processing table of the code modulator shown in FIG. 1. FIG. 9(a) is a pre-processing table in a main table, and FIG. 9(b) is a pre-processing table in a sub-table;

FIG. 11 shows a basic structure of a main table of a conversion table of the prior art code modulator shown in FIG. 10;

FIG. 12 shows a basic structure of a sub-table of the conversion table of the prior art code modulator shown in FIG. 10.

DESCRIPTION OF THE PREFERRED EMBODIMENTS

Figure 1:
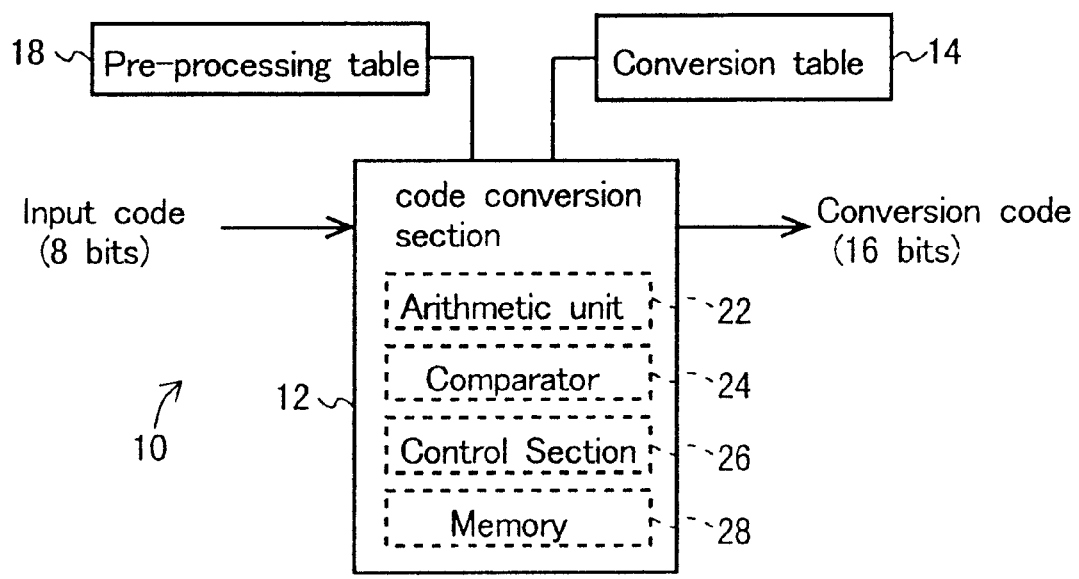
FIG. 1 is a block diagram showing a structural example of a code modulator of the present invention.
Figure 10:
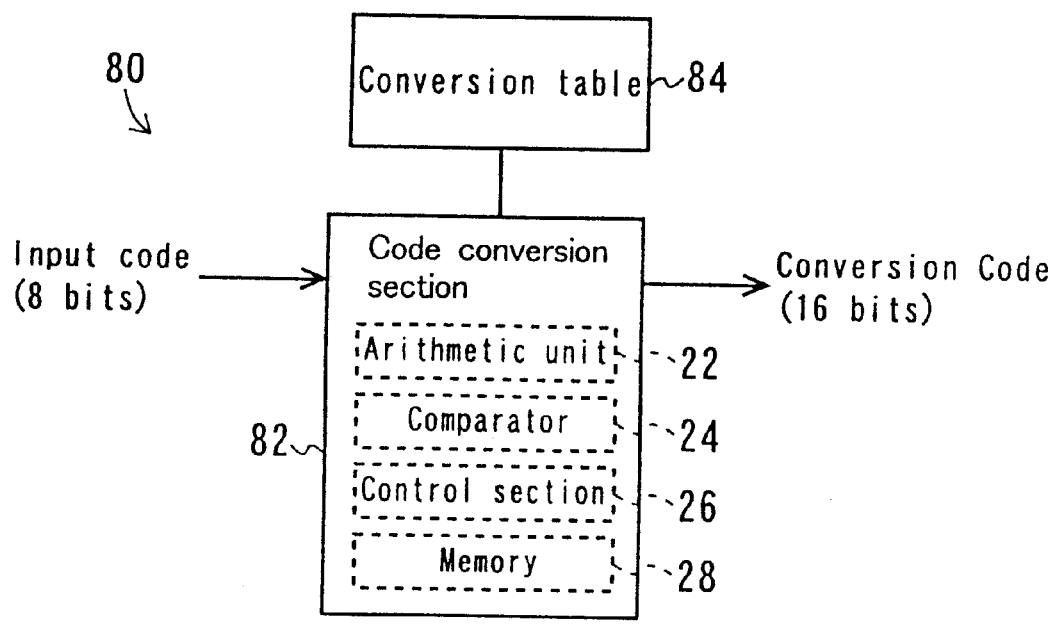
FIG. 10 is a block diagram showing a structural example of a code modulator of the prior art.
Figure 13:
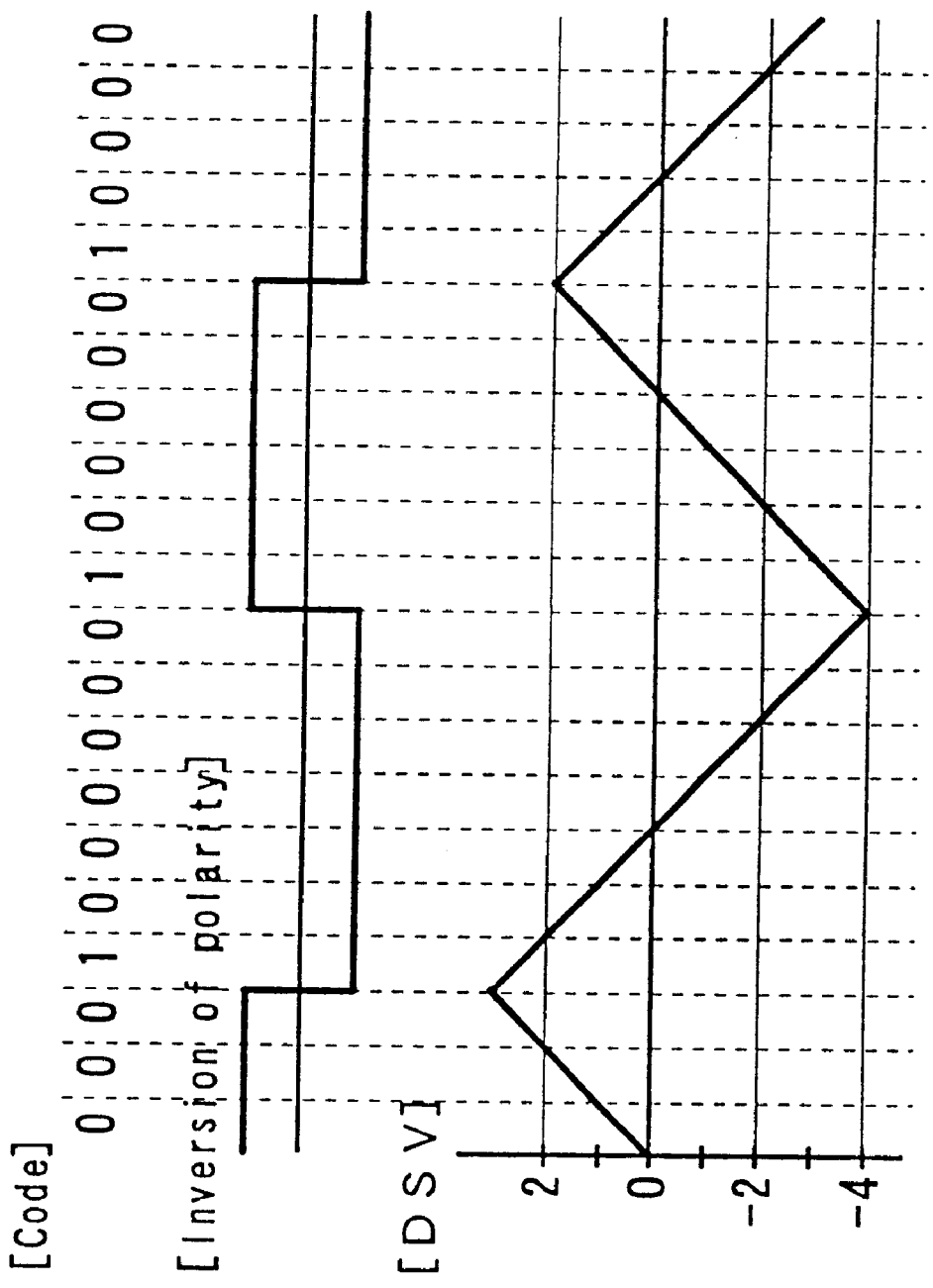
FIG. 13 is an explanatory view of a DSV (digital sum value) as calculated according to the prior art.

The following description is the best mode presently contemplated for carrying out the invention. This description and the number of alternative embodiments shown are made for the purpose of illustrating the general principles of the invention and are not meant to limit the inventive concepts claimed herein. Embodiments of the code modulator and the code modulation method according to the present invention will be described in detail with reference to the accompanying drawings With reference to FIG. 1, the correspondence relationship between the input codes and the conversion codes is the same as that of a conventional modulator (see FIGS. 11 and 12). FIG. 1 shows a structural example of a code modulator 10 according to the present invention. The code modulator 10 comprises: a conversion table 14 for storing conventional codes (see FIGS. 11 and 12) with duplicate codes being omitted; a pre-processing table 18 for storing duplicate pattern information indicating the correspondence relationship between the conversion codes omitted from the conventional conversion codes and conversion codes in the conversion table 14 that are the same as the omitted conversion codes; and a code conversion section 12 for specifying a conversion code to be used from the conventional conversion codes and for reading a conversion code corresponding to an input code from the conversion table 14 on the basis of this specification and the duplicate pattern information in the conversion table.

The pre-processing table 18 comprises code-selection information used for selection of either the conversion code specified by the code conversion section 12 or a conversion code (which is hereinafter referred to as a replaceable conversion code) that can be used in place of the specified conversion code. In this embodiment, the conversion code of STATE 1 and the conversion code of STATE 4 can be used as mutually replaceable conversion codes. The selection of either the specified conversion code or the replaceable conversion code is made in the code conversion section 1 on the basis of the code selection information.

The conversion table 14 stores the plurality of conversion codes (STATES 1 to 4) corresponding to the respective inputs shown in FIGS. 11 and 12, from which duplicate codes are omitted.

Duplicate codes will be now described. In the conversion table shown in FIGS. 11 and 12, duplicate conversion codes are included in the plurality of conversion codes (STATEs 1 to 4) corresponding to the input code. In accordance with STATEs of duplicate codes, the plurality of conversion codes corresponding to each of input codes can be classified into four patterns (patterns A, B, C, and D), which are also referred to as duplicate patterns thereafter.

An example of how to classify the patterns is shown in FIG. 5(a). Conversion codes in which STATE 1 and STATE 2 are equal to each other and STATE 3 and STATE 4 are equal to each other are included in Pattern A. Conversion codes in which STATE 1 and STATE 3 are equal to each other and STATE 2 and STATE 4 are equal to each other are included in Pattern B. Conversion codes in which STATE 1 and STATE 2 are equal to each other but STATE 3 and STATE 4 are different from each other are included in Pattern C. Conversion codes in which STATE 1 and STATE 3 are different from each other but STATE 2 and STATE 4 are equal to each other are included in Pattern D.

The number of input codes corresponding to the respective patterns is shown in FIG. 5(b). In the main table, there are 171 input codes corresponding to Pattern A, 62 input codes corresponding to Pattern B, one input code corresponding to Pattern C and 22 input codes corresponding to Pattern D, for example. In the sub-table, there are 46 input codes corresponding to Pattern A, 4 input codes corresponding to Pattern B, and 38 input codes corresponding to Pattern D, for example. The numbers of these input codes may vary depending on the kinds of conversion tables. However, in most cases, the distribution of the numbers is quite similar to the above examples.

Based on these duplicate Patterns (Patterns A to D) and STATEs (STATEs 1 to 4), the conversion codes can be classified into three groups (Groups 1, 2, 3), as shown in FIG. 6. Group 1 includes conversion codes of STATE 1 (=STATE 2) of Pattern A, STATE 1 (=STATE 3) of Pattern B, STATE 1 (=STATE 2) of Pattern C and STATE 1 of Pattern D. Group 2 includes conversion codes of STATE 4 (=STATE 3) of Pattern A, STATE 4 (=STATE 2) of Pattern B, STATE 4 of Pattern C and STATE 4 (=STATE 2) of Pattern D. Group 3 includes conversion codes of STATE 3 of Pattern C and STATE 3 of Pattern D.

In the conversion table 14, conversion codes with duplicate conversion codes being omitted are stored in each Group (Group 1, 2 or 3), as shown in FIG. 2(a). Group 1 includes conversion codes of STATE 1 of all the Patterns, Group 2 includes conversion codes of STATE 4 of all the Patterns, and Group 3 includes conversion codes of STATE 3 of Pattern C and Pattern D. The conversion codes of GROUP 1 in the main table are shown in FIG. 2(b), and the conversion codes of GROUP 1 in the sub-table are shown in FIG. 2(c).

As clear from FIGS. 5(a) and 5(b) and FIG. 6, the number of conversion codes stored in the main table is:

$$171 \cdot\cdot 2 + 62 \cdot\cdot 2 + 1 \cdot\cdot 3 + 22 \cdot\cdot 3 = 535, \text{ and}$$

the number of conversion codes stored in the sub-table is:

$$46 \cdot\cdot 2 + 4 \cdot\cdot 2 + 0 \cdot\cdot 3 + 38 \cdot\cdot 3 = 214.$$

Therefore, the number of conversion codes stored in the conversion table 14 is:

$$535 + 214 = 749.$$

Since the number of conversion codes stored in the conventional conversion table 84 shown in FIGS. 11 and 12 is 1376, the ratio of the conversion table 14 of the present invention to the conventional conversion table 84 is:

$$749 \cdot\cdot 1376 \cdot\cdot 0.544.$$

As compared with the conventional conversion table, the conversion table 14 of the present invention makes it possible to reduce the number of conversion codes stored therein by approximately half (54.4%).

The determination of Group is made by using the duplicate pattern and the STATE specified by the NS. The duplicate pattern will be hereinafter defined by the pattern code "PT1 PT0". In this case, Pattern A is defined as "PT1 PT0"="0 0", Pattern B is defined as "PT1 PT0"="0 1", Pattern C is defined as "PT1 PT0"="1 0", and Pattern D is defined as "PT1 PT0"="1 1". In addition, the STATE specified by the NS will be hereinafter defined by the state code "ST1 ST0". In this case, STATE 1 is defined as "ST1 ST0"="0 0", STATE 2 is defined as "ST1 ST0"="0 1", STATE 3 is defined as "ST1 ST0"="1 0", and STATE 4 is defined as "ST1 ST0"="1 1". A group (Group 1, 2 or 3) can be determined by using these Pattern codes ("PT1 PT0") and STATE codes ("ST1 ST0").

For example, Group 1 is determined when a solution to the following equation is 1:

"GP1"={(NOT "ST1") AND (NOT "ST0")} OR {(NOT "ST1") AND "ST0" AND (NOT "PT0"} OR {"ST1" AND (NOT"ST0") AND (NOT"PT1") AND "PT0"}    (Equation 1)

In the same manner, Group 3 is specified when a solution to the following equation is 1:

"GP3"="ST1" AND (NOT "ST0") AND "PT1"    (Equation 2)

In the same manner, Group 2 is determined when a solution to the following equation is 1:

"GP2"=(NOT "GP1") AND (NOT "GP3")    (Equation 3)

When a group is determined, conversion codes corresponding to an input is read from the group. Even when the NS specifies conversion codes omitted from the conventional conversion table 84, the group is determined by using these equations 1, 2 and 3, and conversion codes that are same as the omitted conversion codes can be read from the conversion table 14. Without particularly discriminating between the conversion codes omitted from the conversion table 84 and conversion codes not omitted therefrom, the group can be determined by using the equations 1, 2 and 3.

The NS (next STATE) stored in the memory 28, for example, specifies which STATE to select from the plurality of conversion codes (STATEs 1 to 4) corresponding to an input code. However, in this embodiment, when the last one bit or last two bits of the conversion code used in the conversion of the input code is "1" or "1 0", STATE 1 is specified as a conversion code to be used in conversion of the next input code. In the same manner, when the last six bits to nine bits of the conversion code used in the conversion of an input code are continuous "0"s, STATE 4 is specified as a conversion code to be used in the next input code conversion. For this reason, when "1" or "4" is stored in the NS, a next STATE (STATE 1 or STATE 4) can be determined without referring to the NS of the memory 28, but by referring to the conversion code used in the immediately previous code conversion.

Therefore, as shown in FIGS. 2(b) and 2(c), the value of NS to be stored in the conversion table 14 may be limited to "2" or "3". When the conversion code used in the immediately previous code conversion ends with "1"or "1 0", and when the conversion code used in the conversion of an input code ends with continuous "0"s in the last six bits to nine bits, the next STATE (STATE 1 or STATE 4) can be determined with reference to this conversion code. When the last two bits to the last five bits of the conversion code used in immediately previous code conversion are continuous "0"s, the next STATE can not be determined with reference to this conversion code, so that the next STATE (STATE 2 or STATE 3) is determined by referring to the NS value of the memory 28.

A duplicate pattern within the plurality of conversion codes corresponding to an input code can be determined with reference to the pre-processing table 18 shown in FIG. 1. As shown in FIGS. 3 and 4, the pre-processing table 18 stores duplicate patterns (Pattern A, B, C or D) of conversion codes corresponding to the respective inputs. Two bits are required for storing the duplicate patterns (A, B, C or D). When the input code is in a range of 0 to 87, two duplicate patterns, namely, a main table and a sub-table, are stored. Moreover, the pre-processing table 18 also stores a central value (DSVc) of the DSV and the preference bit (PB) which are used for selecting the conversion code (to be described later), and "0" number information to be used for checking the RLL (2. 10), which will be described later. As the conversion table 14 and the pre-processing table 18, ROMs (Read Only Memory) can be generally used.

As shown in FIG. 1, the code conversion section 12 comprises: an arithmetic unit 22 for determining a group and a like by calculating the equations 1, 2 and 3 using the STATE specified by the duplicate pattern and the NS; a comparator 24 for comparing the value obtained by inverting the polarity of the central value DSVc of DSV read from the pre-processing table, which will be described later, with the DSV value obtained up to the current conversion; a memory (storage device) 28 for storing the DSV value obtained up to the current conversion and information (NS) for specifying the next code, and a control section 26 for specifying the next code on the basis of the conversion code used in the immediately previous code conversion, or for specifying the next conversion code on the basis of the NS value stored in the memory 28 and converting the input code by controlling the arithmetic unit 22 and the comparator 24.

The duplicate patterns of the pre-processing table 18 make it clear that a correspondence relationship exists between the conversion codes omitted from the conventional conversion table 84 (see FIGS. 11 and 12) and conversion codes which are the same conversion codes in the conversion table 14 as the omitted conversion codes. In this embodiment, the conversion code within the conversion table 14 is determined by determining a group with reference to the duplicate patterns and STATEs by using the aforementioned equations 1, 2 and 3.

Next, the selection of conversion codes will be described. When the input code is in range of 0 to 87, a corresponding conversion code is selected from either the main table or the sub-table. This selection is made on the basis of the DVS value obtained up to the current conversion and the DVS values of conversion codes in the main table and the sub-table. Supposing the DSV of a conversion code in the main table is indicated by DSVm, the DSV of a conversion code in the sub-table is indicated by DSVs, and the DSV obtained up to the current conversion is indicated by DSVt, either (DSVt+DSVm) or (DSVt+DSVs), namely the one closer to zero, is selected. However, in the conversion tables shown in FIGS. 11 and 12, the DSV of the conversion code in the sub-table is generally greater than that in the main table (DSVm<DSVs) and STATE 1 is greater than STATE 4.

In this embodiment, the central value DSVc of DSV values of candidate conversion codes $$DSVc=(DSVs+DSVm)\div 2 \quad \text{(Equation 4)}$$

and the DSV value (DSVt) obtained up to the current conversion is utilized. More specifically, the value (−DSVc) obtained by inverting the polarity of the DSVc is compared with the DSV value (DSVt) obtained up to the current conversion.

When the DSVt is greater than (−DSVc), that is, when DSVt is represented by the following equation, $$DSVt=-DSVc+N\ (N=1, 2, 3, \ldots)$$

the following equations are obtained:

$$DSVt+DSVs=-DSVc+N+DSVs=(DSVs-DSVm)$$
$$\div 2+N \quad \text{(See equation 4)}$$

$$=K+N(K=(DSVs-DSVm)\div 2>0)\ DSVt+DSVm=-DSVc+N+$$
$$DSVm=-(DSVs-DSVm)\div 2+N \quad \text{(See equation 4)}$$

$$=-K+N(K=(DSVs-DSVm)\div 2>0).$$

Accordingly, it is clear from the above equations that (DSVt+DSVm) is closer to zero, regardless of the value of N. Therefore, when DSVt is greater than (−DSVc), the conversion code in the main table can be selected.

When the DSVt is smaller than (−DSVc), that is, when DSVt is represented by the following equation, $$DSVt=-DSVc-N(N=1, 2, 3, \ldots)$$

the following equations are obtained:

$$DSVt+DSVs=-DSCc-N+DSVs=(DSVs-DSVm)$$
$$\div 2-N \quad \text{(from equation 4)}$$

$$=K-N\ (K=(DSVs-DSVm)\div 2>0)\ DSVt+DSVm=-DSVc-N+$$
$$DSVm=-(DSVs-DSVm)\div 2-N \quad \text{(from equation 4)}$$

$$=-K-N(K=DSVs-DSVm)\div 2>0).$$

Accordingly, it is clear from the above equations that (DSVt+DSVs) is closer to zero, regardless of the value of N. Therefore, when DSVt is smaller than (−DSVc), the conversion code in the sub-table can be selected.

When DSVt is equal to (−DSVc), either main table (PB="M") or sub-table (PB="S") is selected on the basis of the preference bit PB (PB="M" or "S") of the pre-processing table 18. The preference bit PB in FIG. 3 indicates that a conversion code in the main table or sub-table that is greater in the number of times of polarity inversions is to be selected. When the numbers of times of polarity inversions of the conversion cords in the main table and the sub-table are the same, the main table is specified (PB="M"). As shown in FIG. 3, these DSVc and preference bit PB are stored in the pre-processing table 18 for each input code and each STATE. One bit is required for storing the preference bit PB (M or S). In this embodiment, 4 bits are required for storing the DSVc.

When the input code is in a range of 88 to 225, the corresponding conversion code is read from the main table. However, when STATE 1 is specified as the next STATE, the conversion code of STATE 4 can be used in place of STATE 1. Alternatively, when STATE 4 is specified as the next STATE, the conversion code of STATE 1 can be used in place of STATE 4.

The selection of either STATE 1 or STATE 4 is made by utilizing the central value DSVc of the DSV of a conversion code of STATE 1 and the DSV of a conversion code of STATE 4, the preference bit PB in FIG. 4 (PB="1" or "4"), and the DSV value obtained up to the current conversion. The selection method is carried out in the same manner as that of the main table and sub-table. As shown in FIG. 4, these DSVc and preference bit PB are stored in the pre-processing table 18 for each of input codes 88–255. One bit is required for storing the preference bit PB (1 or 4). In this embodiments, 4 bits are required for storing the DSVc.

However, in order to select either STATE 1 or STATE 4, it is necessary to check whether a conversion code to be used in place of the originally specified conversion code satisfies the RLL (2. 10) requirements. This checking process is carried out by using the "0" number information in the pre-processing table 18.

Now, "0" number information will be described. When last one bit or last two bits of the conversion code used in the conversion of the input code is "1"or "1 0", the code of STATE 1 is specified as a conversion code to be used next in this embodiment. The first one bit or the first two bits of the code of STATE 4 is "1" or "0 1". For this reason, when the code of STATE 4 is used in place of STATE 1, at least the first bit of the conversion code of STATE 4 has to be "0" in order to satisfy the RLL (2. 10) requirements. More specifically, the RLL (2. 10) requirements are satisfied only when the last two bits of the conversion code used in the immediately previous conversion is "1 0" and the first two bits of the conversion code of STATE 4 to be used in the next conversion is "0 1". Therefore, by examining the first bit ("0" or "1") of the conversion code of STATE 4, it is possible to check the RLL (2. 10) requirements without reading the conversion code.

In the same manner, when the last six bits to nine bits of the conversion code used in an input code conversion are continuous "0"s, the conversion code of STATE 4 is specified as a conversion code to be used next in this embodiment. The first two bits to nine bits of the code of STATE 1 are continuous "0". For this reason, when the code of STATE 1 is used in place of, STATE 4, the conversion code of STATE 1 has to start with continuous "0" in the first two bits to four bits in order to satisfy the RLL (2. 10) requirements. More specifically, the RLL (2. 10) requirements are satisfied only when the last six bits of the conversion code used in the immediately previous conversion are continuous "0" and the first two bits to four bits of the conversion code of STATE 1 to be used in the next conversion are continuous "0", or when the last seven bits of the conversion code used in the immediately previous conversion are continuous "0" and the first two bits or three bits of the conversion code of STATE 1 to be used in the next conversion are continuous "0", or when the last eight bits of the conversion code used in the immediately previous conversion are continuous "0" and the first two bits of the conversion code of STATE 1 to be used in the next conversion are continuous "0". Therefore, by examining the number of "0"s of the first several bits of the conversion code of STATE 1 (whether the number is 2, 3, 4, or not less than 5), it is possible to check the RLL (2. 10) requirements without reading the conversion code.

As shown in FIG. 4, the number of "0"s leading the conversion code in STATE 1 and STATE 4 is stored in each input code as the "0" number information. In FIG. 4, the number "5" in STATE 1 indicates that the number of "0"s is 5 or more. In the "0" number information in STATE 4, information of the first bit of the conversion code ("0" or "1") is stored. Two bits are required for storing the "0" number information (2, 3, 4 or 5) of STATE 1, and one bit is required for storing the "0" number information (0 or 1) of STATE 4.

Next, the function of an 8/16 modulation system in which the above-mentioned modulator and modulation method are adopted will be described. In the following description, the initial reglue of the NS to be stored in the memory 28 is "1" and the conversion code of STATE 1 is used at the time of the first code conversion.

When the input code is in a range of 0 to 87, the next STATE is identified either STATE 1 or STATE 2 on the basis of the conversion code used in the immediately previous code conversion. Where the last two to five bits of the conversion code used in the immediately previous code conversion are continuous "0"s, the next STATE cannot be identified on the basis of this conversion code. Therefore, the next STATE is identified as either STATE 2 or STATE 3 with reference to the NS value stored in the memory 28.

After the identification of the next STATE, the DSVc corresponding to the input code and the STATE is read with reference to the pre-processing table 18 (see FIG. 3). After that, comparison is made between the DSV value obtained up to the current conversion stored in the memory 28 and the value (••DSVc) obtained by inverting the DSVc. If the DSV value obtained up to the current conversion is greater, the main table is selected. If the DSV value obtained up to the current conversion is smaller, the sub-table is selected. If they are the same, the main table or the sub-table is selected with reference to the preference bit PB in the pre-processing table.

When the main table or the sub-table is selected, the duplicate pattern corresponding to the input code is read from the pre-processing table. Thus, the table (main or sub), STATE and duplicate pattern of the conversion code to be used are obtained. After obtaining the STATE and the duplicate pattern, a corresponding group can be determined by the aforementioned equations 1, 2 and 3. The determination of the table (main or sub) and the group allows a corresponding conversion code of the determined group to be read from the conversion table 14.

In this manner, in the code modulator and the code modulation method of the present invention, the next STATE is identified as either STATE 1 or STATE 4 on the basis of the immediately previous conversion code. Therefore, the NS value to be stored in the conversion table can be limited to "2" or "3". Moreover, the selection of either the main table or the sub-table can be made through a simple comparison between the DSV obtained up to the current conversion stored in the memory 28 and the inverted value of the DSVc (4 bits) in the pre-processing table. Furthermore, when the current DSV and the inverted value of the DSVc are equal to each other, the selection can be made only by referring to the preference bit PB (1 bit) in the pre-processing table. Thus, it is only necessary to read the conversion code once, so that a higher processing speed can be achieved.

In the same manner as in the case of the input code in the rage of 0 to 87, when the input code is in a range of 88 to 225, the next STATE is first identified. When STATE 1 or STATE 4 is specified as the next STATE, selection of either STATE 1 and STATE 4 is made. When STATE 2 or STATE 3 is specified as the next STATE, the conversion code of STATE 2 or STATE 3 is utilized.

In the selection of STATE 1 and STATE 4, "0" number information is read from the pre-processing table (See FIG. 4) first and then it is checked whether the RLL (2. 10) requirements are satisfied or not. More specifically, when STATE 1 is specified as the next STATE, STATE 4 is also a candidate for selection. Therefore, the "0" number information of STATE 4 is read, and the RLL (2. 10) requirements are checked by using the conversion code used in the immediately previous code conversion and this "0" number information. When STATE 4 is specified as the next STATE, STATE 1 is also a candidate for selection. Therefore, the "0" number information of STATE 1 is read, and the RLL (2. 10) requirements are checked by using the conversion code used in the immediately previous code conversion and this "0" number information.

If the RLL (2. 10) requirements are not satisfied, the conversion code of the originally specified STATE is used. If the RLL (2. 10) are satisfied, the DSVc is read from the pre-processing table, and the selection of either STATE 1 or STATE 4 is made in the same manner as the above-mentioned selection of either the main table or sub-table.

As described above, when the STATE is selected and the duplicate pattern corresponding to the input code is read from the pre-processing table 18 (FIG. 4), the STATE and the duplicate pattern are determined, and therefore the corresponding group is specified on the basis of the aforementioned equations 1, 2 and 3. Once the group is specified, the conversion code of the specified group can be read from the conversion table 14.

As described above, in the code modulator and the code modulation method of the present invention, the RLL (2. 10) requirements can be checked by using the conversion code used in the immediately previous conversion and the "0" number information (1 bit or 2 bits) in the pre-processing table. Moreover, a selection of either STATE 1 or STATE 4 can be made only through the comparison between the DSV value obtained up to the current conversion stored in the memory 28 and the inverted value of the DSVc (4 bits) in the pre-processing table. In this way, the conversion code can be read only once, and processes including the checking process for the RLL (2. 10) requirements can be carried out at higher speed.

One embodiment of the present invention has thus been described, however, the code modulator and the code modulation method of the present invention can be also materialized in other embodiments. For example, in place of the central value DSVc of the DSV, which is stored in the pre-processing table, the inverted value (••DSVc) of the central value DSVc can be stored.

As shown in FIGS. 7 and 8(a), the preference bit PB can be omitted from the pre-processing table. However, when the DSV obtained up to the current conversion and the DSVc are equal to each other, it is predetermined that STATE 1 is selected when an input is in a range of 0 to 87, and that STATE 2 is selected when an input code is in a range of 88 to 225. Thus, the size of the pre-processing table can be further reduced when the preference bit PB is omitted. The preference bit which depends on the number of times that conversion code is inverted in polarity is preferably used, however, it may not be always used.

As shown in FIG. 8(b), the "0" number information can be omitted from the pre-processing table. When the "0" number information is removed therefrom, the processing time becomes longer because the RLL (2. 10) requirements are checked in the conventional manner, but the size of the pre-processing table becomes smaller. Although not shown in the figures, both of the preference bit PB and the "0" number information can be also omitted from the pre-processing table.

As shown in FIGS. 9(a) and 9(b), only the duplicate pattern can be stored in the pre-processing table. In this case, since the central value (DSVc) of the DSV, the preference bit (PB) and "0" number information are omitted, the speed of selecting the conversion code and the speed of checking the RLL (2. 10) requirements are not changed from the conventional speeds, however, the size of the pre-processing table 18 can be further reduced.

The duplicate patterns can be omitted from the pre-processing table shown in FIGS. 3, 4, 7 and 8(a) and 8(b). When the duplicate patterns are omitted, the size of the conversion table 14 is substantially the same as that of conventional systems, but the speed of selecting the conversion code and the speed of checking the RLL (2. 10) requirements are improved as compared with conventional systems.

The code modulator and the code modulation method of the present invention have thus been described with 8/16 modulation taken as an example, however, the present invention is not limited to 8/16 modulation. The present invention can be used for converting an input code to one of a plurality of conversion codes, some of which are duplicate, for converting a specified conversion code to a usable conversion code, and the like.

While the embodiments of the present invention have thus been described with reference to the drawings, it should be understood that the present invention be not limited to the code modulator and the code modulation method shown in the drawings. In addition, various changes, modifications and improvements can be made to the embodiments on the basis of knowledge of those skilled in the art without departing from the scope of the present invention.

What is claimed is:

1. A code modulator for converting an input code to one of a plurality of conversion codes, comprising:
    a conversion table for storing conversion codes corresponding to input codes with duplicate conversion codes being omitted from said plurality of conversion codes;
    a pre-processing table for storing duplication information indicating a correspondence relationship between the conversion codes omitted from said plurality of conversion codes and the same conversion codes in the conversion table as the omitted conversion codes;
    code specifying means for specifying a conversion code to be used from said plurality of conversion codes; and
    code conversion means for reading a conversion code corresponding to an input code from said conversion table on the basis of the specification done by said code specifying means and the duplication information stored in the pre-processing table.

2. The code modulator according to claim 1, wherein said code conversion means comprises means for specifying the same conversion code in the pre-processing table as the conversion code omitted from the plurality of conversion codes on the basis of the duplication information, when the code specifying means specifies the omitted conversion code.

3. The code modulator according to claim 1, wherein said plurality of conversion codes include a conversion code capable of being used in place of the conversion code specified by the code specifying means (hereinafter referred to as "replaceable conversion code");
    said preprocessing table includes code selection information to be used for selecting either the specified conversion code or the replaceable conversion code; and
    said code conversion means comprises code selection means for selecting either the specified conversion code or the replaceable conversion code on the basis of the code selection information.

4. The code modulator according to claim 3, wherein
    said code selection information includes a central value of a digital sum value of the specified conversion code and a digital sum value of the replaceable conversion code; and
    said code selection means comprises comparison means for comparing an inverted value of the central value of the digital sum value with an accumulation value of digital sum values of the conversion codes used up to the current conversion.

5. The code modulator according to claim 4, wherein said code selection information includes preference information for specifying either the specified conversion code or the replaceable conversion code.

6. The code modulator according to claim 1, wherein
    said input code is an 8-bit code;
    said conversion code is a 16-bit code; and
    said conversion code forms a bit string, wherein the number of bits having a "0" value positioned between two bits having a "1" value is two to ten.

7. The code modulator according to claim 1, wherein
    said pre-processing table includes information on the number of bits having a "0" value leading the replaceable conversion code; and
    said code selection means comprises a means for checking that the number of bits having a "0" value positioned between two bits having a "1" value is two to ten when the replaceable conversion code is connected to a conversion code used in an immediately previous code conversion on the basis of the conversion code used in the immediately previous code conversion and the information on the number of bits having a "0" value leading the replaceable conversion code.

8. The code modulator according to claim 1, wherein
    said code specifying means comprises means for determining a conversion code to be used in the next code conversion on the basis of the conversion code used in the immediately previous code conversion.

9. The code modulator according to claim 1, wherein
    said conversion table includes information added to each conversion code and specifying a conversion code to be used in a next code conversion following the conversion of the conversion code;
    said code specifying means comprises means for storing the information specifying the conversion code to be used in the next conversion.

10. A code modulation method for converting an input code to one of a plurality of conversion codes, comprising:

a code specifying step of specifying a conversion code to be used from a plurality of conversion codes corresponding to an input code;

a step of reading duplication information corresponding to the input code from a pre-processing table in which the duplication information indicating duplicate conversion codes in the plurality of conversion codes is stored; and a code conversion step of reading a conversion code corresponding to the input code from the conversion table which stores conversion codes with duplicate codes being omitted on the basis of the specification of the code specifying step and the duplication information read from the pre-processing table.

11. The code modulation method according to claim 10, wherein said code conversion step comprises a step of identifying the same conversion code in the conversion table as the omitted conversion code on the basis of the duplication
information read from the pre-processing table when a conversion code omitted from the plurality of conversion codes is specified in the code specifying step.

12. The code modulation method according to claim 10, wherein said code conversion step comprises:

a step of checking the presence of a conversion code capable of being used in place of the conversion code specified by the code specifying means (hereinafter referred to as "replaceable conversion code") in said plurality of conversion codes;

a step of reading code selection information of the replaceable conversion code from the pre-processing table in which code selection information to be used for selecting either the specified conversion code or the replaceable conversion code is stored; and a code selection step of selecting either the specified conversion code or the replaceable conversion code on the basis of the read code selection information.

13. The code modulation method according to claim 12, wherein said code selection information includes a central value of a digital sum value of the specified conversion code and a digital sum value of the replaceable conversion code; and said code selection step comprises:

a step of determining an inverted value of the central value of the digital sum value;

a step of determining an accumulation value of digital sum values of the conversion codes used up to the current conversion; and a comparison step of comparing the inverted value and the accumulation value.

14. The code modulation method according to claim 13, wherein said code selection information includes preference information for specifying either the specified conversion code or the replaceable conversion code; and said code selection step comprises a step of selecting either the specified conversion code or the replaceable conversion code on the basis of the preference information when the inverted value and the accumulation value are equal to each other.

15. The code modulation method according to claim 12, wherein said code selection information includes information on the number of bits having a "0" value leading the replaceable conversion code; and said code selection step comprises:

a step of determining the number of bits having a "0" value positioned between two bits having a "1" value when the replaceable conversion code is connected to the conversion code used in the immediately previous conversion code on the basis of the immediately previous conversion code and the information on the number of bits having a "0" value leading the replaceable conversion code; and a step of checking that the number of bits having a "0" value positioned between two bits having a "1" value is two to ten.

16. The code modulation method according to claim 10, wherein said code specifying step comprises a step of determining a conversion code to be used in the next code conversion on the basis of the conversion code used in the immediately previous code conversion.

17. The code modulation method according to claim 10, wherein said code specifying step comprises the steps of:

storing information specifying a conversion code to be used in the next code conversion following the conversion of the conversion code;

reading the stored information specifying the conversion code to be used in the next code conversion when the next input code is converted.

* * * * *